United States Patent
Liu

(10) Patent No.: US 9,105,528 B2
(45) Date of Patent: Aug. 11, 2015

(54) DISPLAY PANEL STRUCTURE OF ELECTROPHORETIC DISPLAY DEVICE WITH FLAT PROTECTION LAYER OVER ACTIVE REGION AND PROTECTION CIRCUIT REGION

(75) Inventor: Chuan-Feng Liu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 945 days.

(21) Appl. No.: 13/106,882

(22) Filed: May 13, 2011

(65) Prior Publication Data

US 2012/0153283 A1    Jun. 21, 2012

(30) Foreign Application Priority Data

Dec. 15, 2010  (TW) ................................. 099144012

(51) Int. Cl.
  *H01L 33/08*  (2010.01)
  *H01L 27/12*  (2006.01)
  *G02F 1/1362*  (2006.01)
  *G02F 1/167*  (2006.01)
(52) U.S. Cl.
  CPC ...... *H01L 27/1288* (2013.01); *G02F 1/136204* (2013.01); *G02F 1/167* (2013.01)
(58) Field of Classification Search
  CPC ................................................. G02F 1/136204
  USPC ............................................ 257/52, E33.004
  See application file for complete search history.

(56) References Cited

U.S. PATENT DOCUMENTS

| 6,072,550 | A | * | 6/2000 | Kim ................................. 349/40 |
| 6,847,083 | B2 | | 1/2005 | Murai |
| 6,847,422 | B2 | | 1/2005 | Zhang et al. |
| 7,630,049 | B2 | | 12/2009 | Hashiguchi et al. |
| 2004/0027502 | A1 | * | 2/2004 | Tanaka et al. .................... 349/40 |
| 2007/0272983 | A1 | * | 11/2007 | Liao et al. ...................... 257/359 |
| 2007/0273802 | A1 | * | 11/2007 | Nakamura ....................... 349/40 |
| 2008/0061333 | A1 | * | 3/2008 | Hidaka .......................... 257/295 |
| 2008/0117345 | A1 | * | 5/2008 | Ishii et al. ........................ 349/40 |
| 2010/0065839 | A1 | * | 3/2010 | Yamazaki et al. .............. 257/43 |

FOREIGN PATENT DOCUMENTS

| CN | 101078845 | A | 11/2007 |
| CN | 101221330 | A | 7/2008 |
| JP | 2005301223 | A | 10/2005 |
| JP | 2008129374 | A | 6/2008 |
| JP | 2010097203 | A | 4/2010 |
| TW | 561304 | | 11/2003 |
| TW | 591802 | | 6/2004 |

* cited by examiner

*Primary Examiner* — Mohammad Islam
*Assistant Examiner* — John P Dulka
(74) *Attorney, Agent, or Firm* — CKC & Partners Co., Ltd.

(57) ABSTRACT

A display device structure includes a substrate having an active region and an electrostatic protection circuit region. The first metal layer, the first insulation layer, and an amorphous silicon layer are sequentially disposed on the substrate; the first opening passes through the first insulation layer for exposing part of the first metal layer. The second metal layer, disposed on the first insulation layer or the amorphous silicon layer, fills the first opening to contact with the first metal layer; the second insulation layer and the flat layer are disposed on the second metal layer, in which the region of the flat layer overlaps the electrostatic protection circuit region. The second opening passes through the second insulation layer and the flat layer for exposing the second metal layer, in which the third metal layer fills the second opening to contact with the second metal layer.

10 Claims, 10 Drawing Sheets

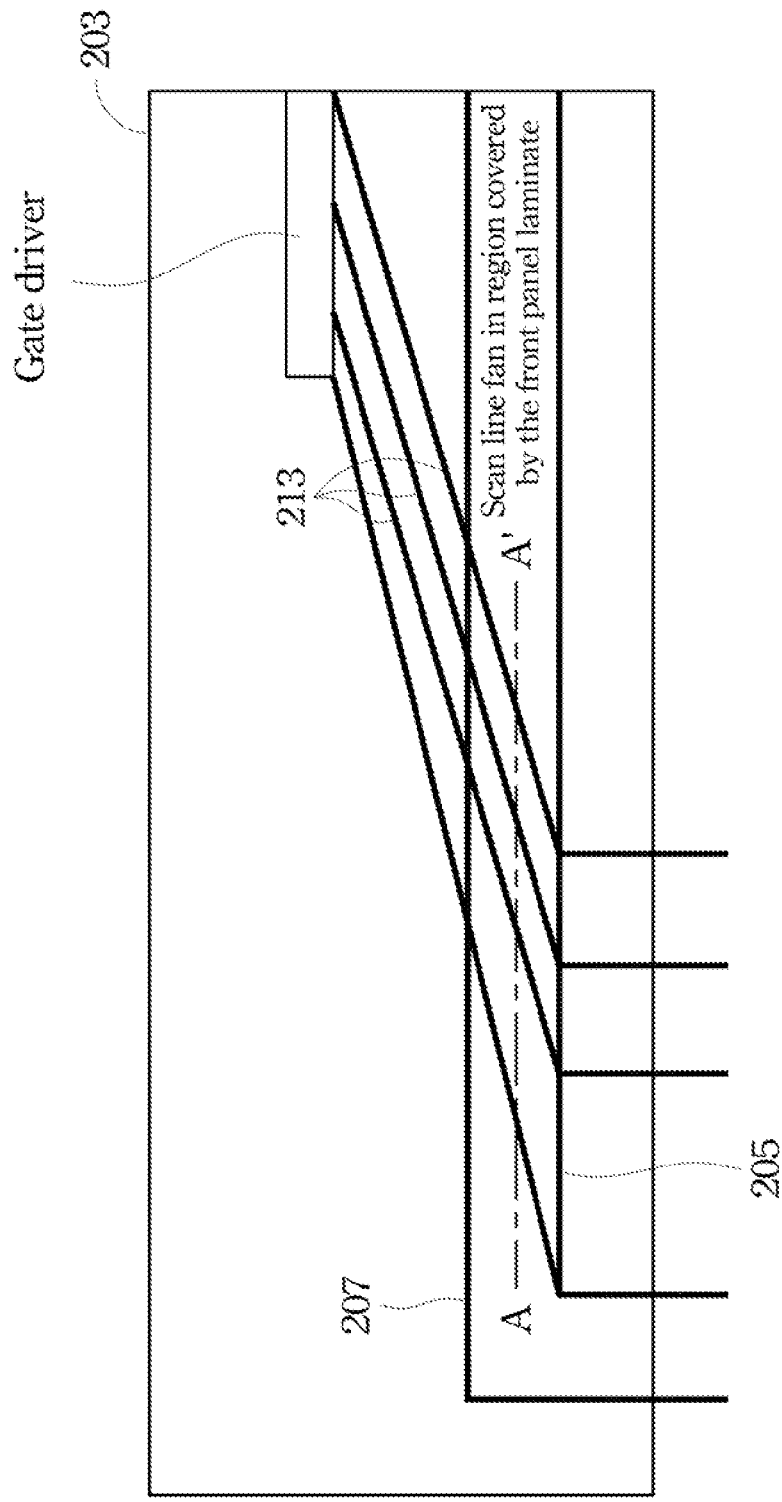

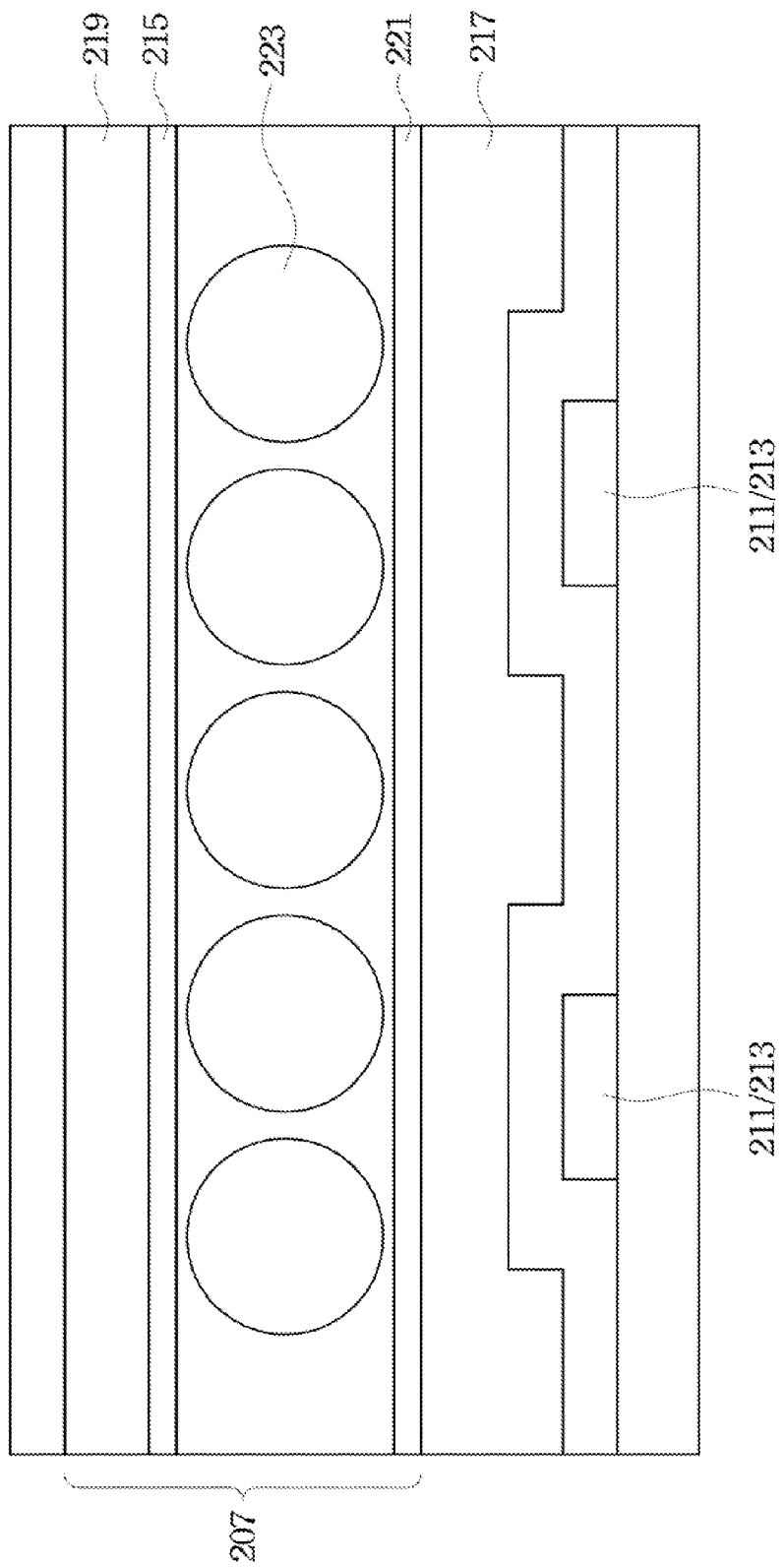

DISPLAY PANEL STRUCTURE OF ELECTROPHORETIC DISPLAY DEVICE WITH FLAT PROTECTION LAYER OVER ACTIVE REGION AND PROTECTION CIRCUIT REGION

RELATED APPLICATIONS

This application claims priority to Taiwan Application Serial Number 099144012, filed Dec. 15, 2010, which is herein incorporated by reference.

BACKGROUND

1. Field of Invention

The present invention relates to a display device structure and a manufacturing method thereof. More particularly, the present invention relates to an electrophoretic display device and manufacturing method thereof.

2. Description of Related Art

The electrophoretic display device, also known as the electronic paper display device (Electronic Paper Display; EPD), has a thin and flexible outlook and the low power consumption. The electrophoretic display device provides the users the book reading like feeling. The electrophoretic display device can update the information via the electronic ink (E-ink) technology as well as the charges. The E-Ink technology is applied to the electrophoretic display device without the front light module or the back light module and is viewable even under the direct sunlight. An image on the screen of the electrophoretic display device can be retained even when all power sources are removed.

The electronic ink is mainly composed of millions of tiny particles, and the size of particles is roughly equal to the size of the human hair. In general, each tiny particle contains the white particles with the positive charges and the black particles with the negative charges, in which these particles suspend in the serum. When the electric field is applied, the white particles with the positive charges move to the end and appear white, while the black particles with the negative charges move to the other end and appear black.

During the manufacturing process of the electronic ink display, the electrostatic charge accumulates on the manufacture equipment, the display panel, the process practitioners, or somewhere else. During the manufacturing process, the ESD (Electrostatic Discharge) phenomenon occurs when the electronic ink display panel touches the manufacturer equipment, the process practitioners, or the substance carrying the static charge. Because the components of the electronic ink display device have very small size, the electrostatic discharge phenomenon will cause serious damage to the electronic ink display device. Taking the current electronic ink display device as the example, the electrostatic discharge phenomenon usually causes the abnormal displaying or the line defects on the display panel, such as the abnormal pixels in the external circuit outside the display area or the abnormal column/row pixels within the display area near the external matrix. This will decrease the manufacturing yield of the electronic ink display panel and the life cycle of the product.

FIG. 1A, and FIG. 1B show the cross sectional views of the conventional display device structures, in which the display device structure mainly includes the active region 111, the electrostatic protection circuit region 109, and the test circuit region 115. The first metal layer 103 and the second metal layer 105 are usually connected through the outermost third metal layer 101. However, during attaching the front plane laminate, the static electricity from the front plane laminate is easy to be transferred to the external circuit or other circuit through the third metal layer 101, which causes the short-circuit, and the panel defect or the abnormal displaying occurs. On the other hand, the potential of the data line or scan line located outside the display area causes the front panel laminate 107 to release the ions, and the ions with the water vapor form the chemicals that corrodes the insulating layer, thus the metal layer under the insulating layer is not protected. If the display device structure is exposed in the hot and humid environment, the water and the vapor will permeate therein and corrode the second metal layer 105 as well as the first metal layer 103, which causes the panel defects or the abnormal displaying.

Therefore, how to prevent the electrostatic discharge current from damaging the display device and how to improve the life cycle of the product have become an important issue for the electrophoretic display device.

SUMMARY

According to one embodiment of the present invention, a method for manufacturing a display device is disclosed. The method provides a substrate, defines an active region on the substrate, forms a first metal layer on the substrate; patterns the first metal layer with a first mask process; sequentially forms a first insulation layer and an amorphous silicon layer on the first metal layer; patterns the amorphous silicon layer with a second mask process; patterns the first insulation layer with a third mask process to form a first opening for exposing part of the first metal layer; forms a second metal layer on the first insulation layer or the amorphous silicon layer, in which the second metal layer fills the first opening to contact with the first metal layer; patterns the second metal layer with a fourth mask process to form a source region and a drain region; forms a second insulation layer and a flat layer on the second metal layer; patterns the second insulation layer and the flat layer with a fifth mask process; forms a third metal layer on the flat layer; and patterns the third metal layer with a sixth mask process.

According to another embodiment of the present invention, a method for manufacturing a display device which adopts an electrophoretic display panel is disclosed. The method provides a substrate; defines an active region and a electrostatic protection circuit region adjacent to the active region on the substrate; forms a first metal layer on the substrate; patterns the first metal layer with a first mask process; sequentially forms a first insulation layer and an amorphous silicon layer on the first metal layer; patterns the amorphous silicon layer with a second mask process; patterns the first insulation layer with a third mask process to form a first opening for exposing part of the first metal layer; forms a second metal layer on the first insulation layer or the amorphous silicon layer, in which the second metal layer fills the first opening to contact with the first metal layer; patterns the second metal layer with a fourth mask process to form a source region and a drain region; forms a second insulation layer and a flat layer on the second metal layer, in which the flat layer is overlapped the test circuit region; patterns the second insulation layer and the flat layer with a fifth mask process; forms a third metal layer on the flat layer; and patterns the third metal layer with a sixth mask process.

According to still another embodiment of the present invention, a method for manufacturing a display device which adopts an electrophoretic display panel is disclosed. The method provides a substrate; defines an active region and a data line fan in region adjacent to the active region on the substrate; forms a first metal layer on the substrate; patterns the first metal layer with a first mask process; sequentially forms a first insulation layer and an amorphous silicon layer on the first metal layer; patterns the amorphous silicon layer with a second mask process; patterns the first insulation layer with a third mask process to form a first opening for exposing part of the first metal layer; forms a second metal layer on the first insulation layer or the amorphous silicon layer, in which the second metal layer fills the first opening, to contact with the first metal layer; patterns the second metal layer with a fourth mask process to form a source region and a drain region; forms a second insulation layer and a flat layer on the second metal layer, in which the flat layer is overlapped the data line fan in region covered by a region of a front plane laminate; patterns the second insulation layer and the flat layer with a fifth mask process; forms a third metal layer on the flat layer; and patterns the third metal layer with a sixth mask process.

According to stilt another embodiment of the present invention, a display device structure is disclosed. The display device structure includes a substrate, a first metal layer, a first insulation layer, an amorphous silicon layer, a first opening, a second metal layer, a second opening, a second insulation layer, and a flat layer. The substrate includes an active region and an electrostatic protection circuit region adjacent to the active region. The first metal layer is disposed on the substrate; the first insulation layer is disposed on the first metal layer of the active region; the amorphous silicon layer is disposed on the first insulation layer; the first opening passes through the first insulation layer and the amorphous silicon layer for exposing part of the first metal layer; the second metal layer is disposed on the first insulation layer and the amorphous silicon layer of the active region, in which the second metal layer fills the first opening to contact with the first metal layer; the second opening passes through the second metal layer for exposing, part of the amorphous silicon layer; the second insulation layer is disposed on the second metal layer and fills the second opening for contacting the amorphous silicon layer; and the flat layer is disposed on the second insulation layer, in which region of the flat layer overlaps the electrostatic protection circuit region.

According to the other embodiment of the present invention, a display panel structure of an electrophoretic display device is disclosed. The display panel structure includes a substrate, a first metal layer, a first insulation layer, an amorphous silicon layer, a second metal layer, a second insulation layer, a flat layer, and a third metal layer. The substrate includes an active region and a data line fan in region adjacent to the active region. The first metal layer is disposed on the substrate, and the first insulation layer is disposed on the first metal layer of the active region. The amorphous silicon layer is disposed on the first insulation layer, the second metal layer is disposed on the first insulation layer or the amorphous silicon layer of the active region, and the second insulation layer is disposed on the second metal layer. The flat layer is disposed on the second insulation layer, in which region of the flat layer is overlapped the scan line fan in region covered by a region of a front plane laminate, and the third metal layer is disposed on the flat layer.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 2C and FIG. 2D show the circuit diagram of the partial panel of the display device according to one embodiment of the invention;

FIG. 2E shows the cross section view of the partial display device according to one embodiment of the invention;

DESCRIPTION OF THE PREFERRED EMBODIMENTS

Figure 1A:
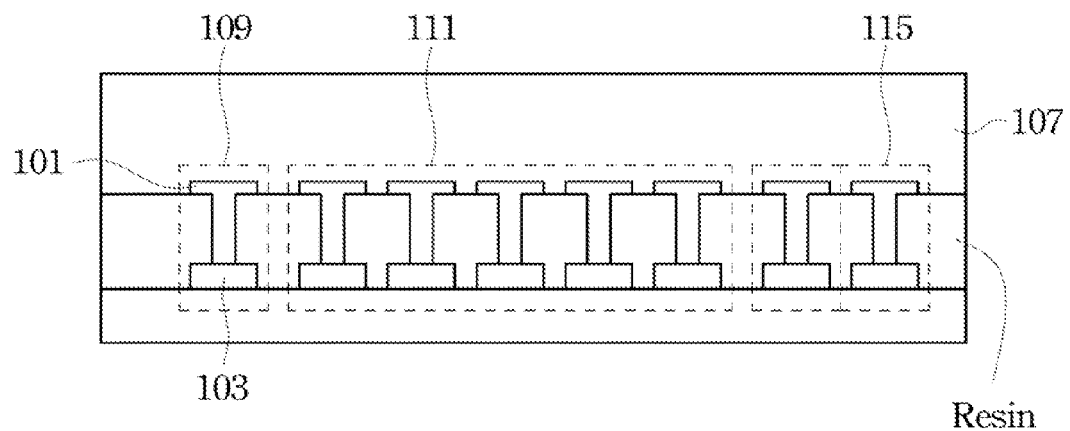
FIG. 1A, and FIG. 1B show the cross section views of the conventional display structure.
Figure 1B:
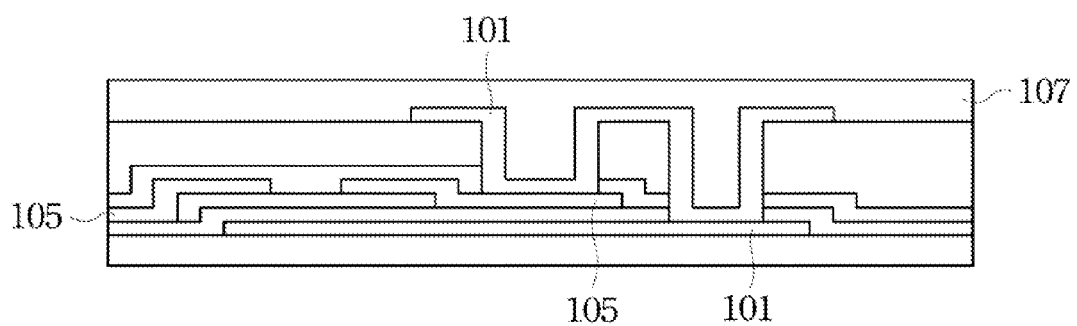

Reference will now be made in detail to the present preferred embodiments of the invention, examples of which are illustrated in the accompanying drawings. Wherever possible, the same reference numbers are used in the drawings and the description to refer to the same or like parts.

The display device structure and the method for manufacturing the display device of the following embodiments take six mask processes to manufacture the display device structure, in which the opening is employed to connect the first metal layer to the second metal layer, and the flat layer is coated over the electrostatic protection circuit region as well as the test circuit region of the display device to strengthen the anti-electrostatic capability, which prevents the metal layer from being corroded by the water vapor.

Figure 2A:
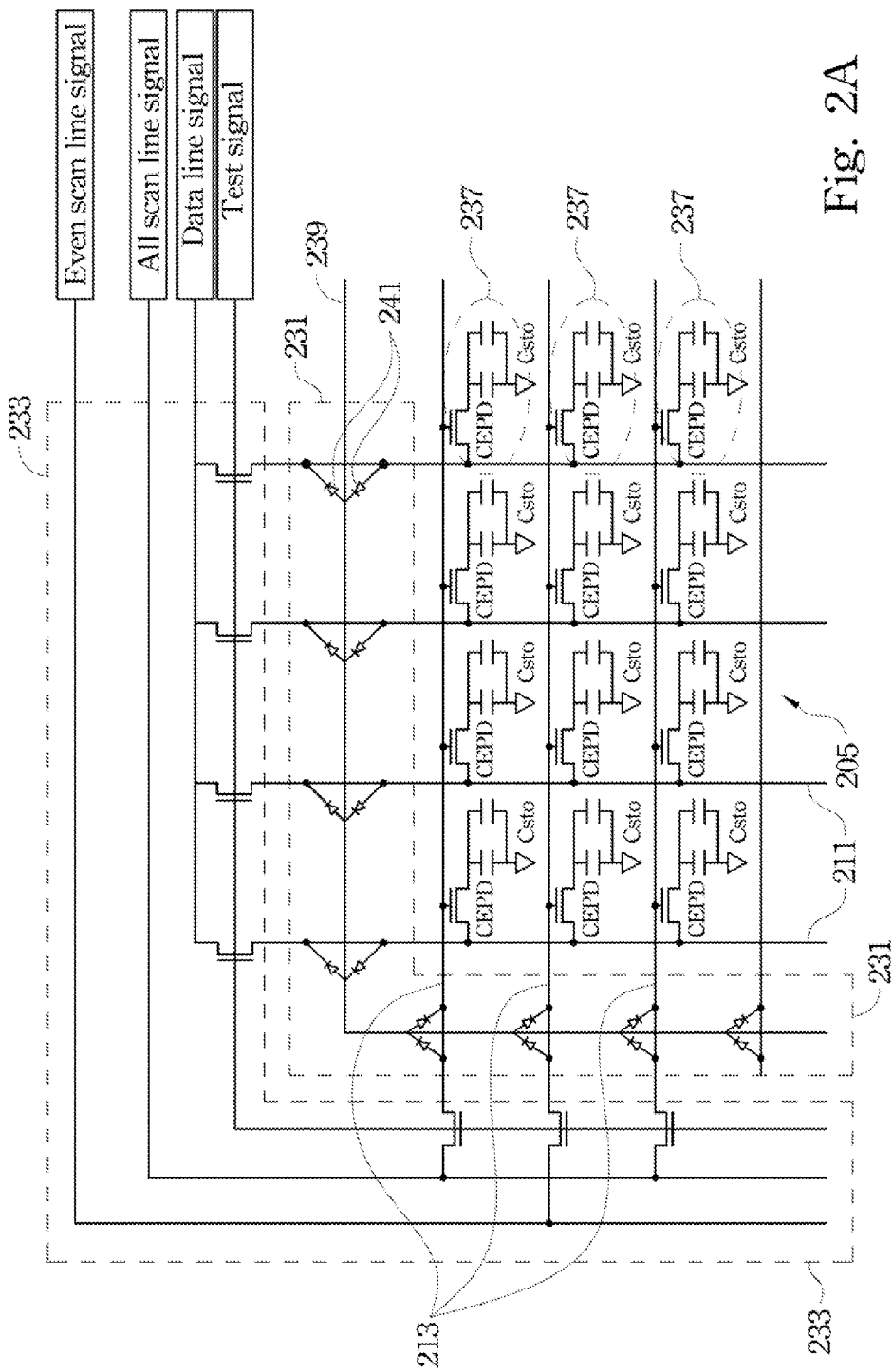
FIG. 2A shows the circuit diagram of the display device's panel according to one embodiment of the invention.
Figure 2B:
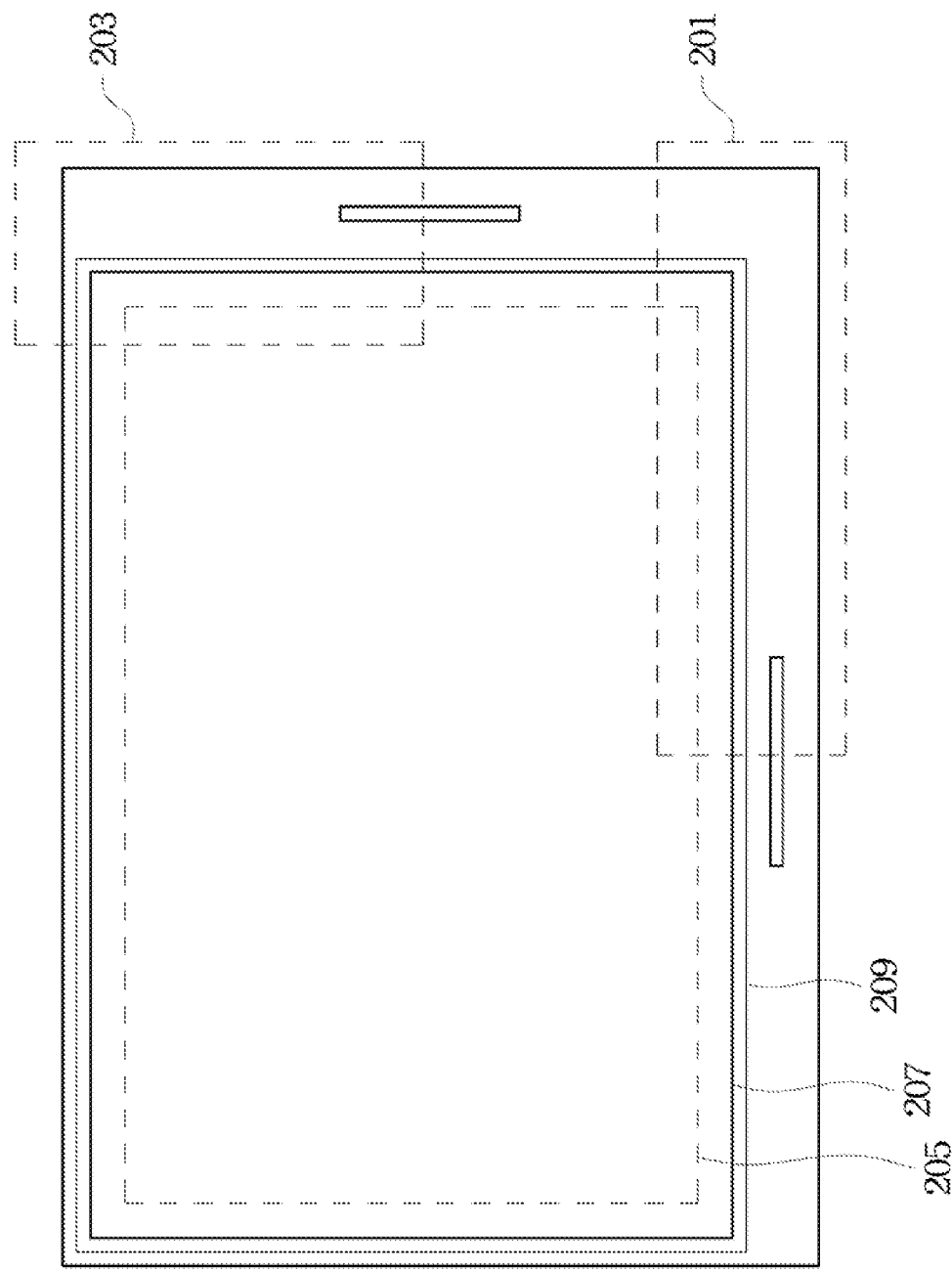
FIG. 2B shows the top view of the placement of the display device's panel according to one embodiment of the invention.
Figure 2C:
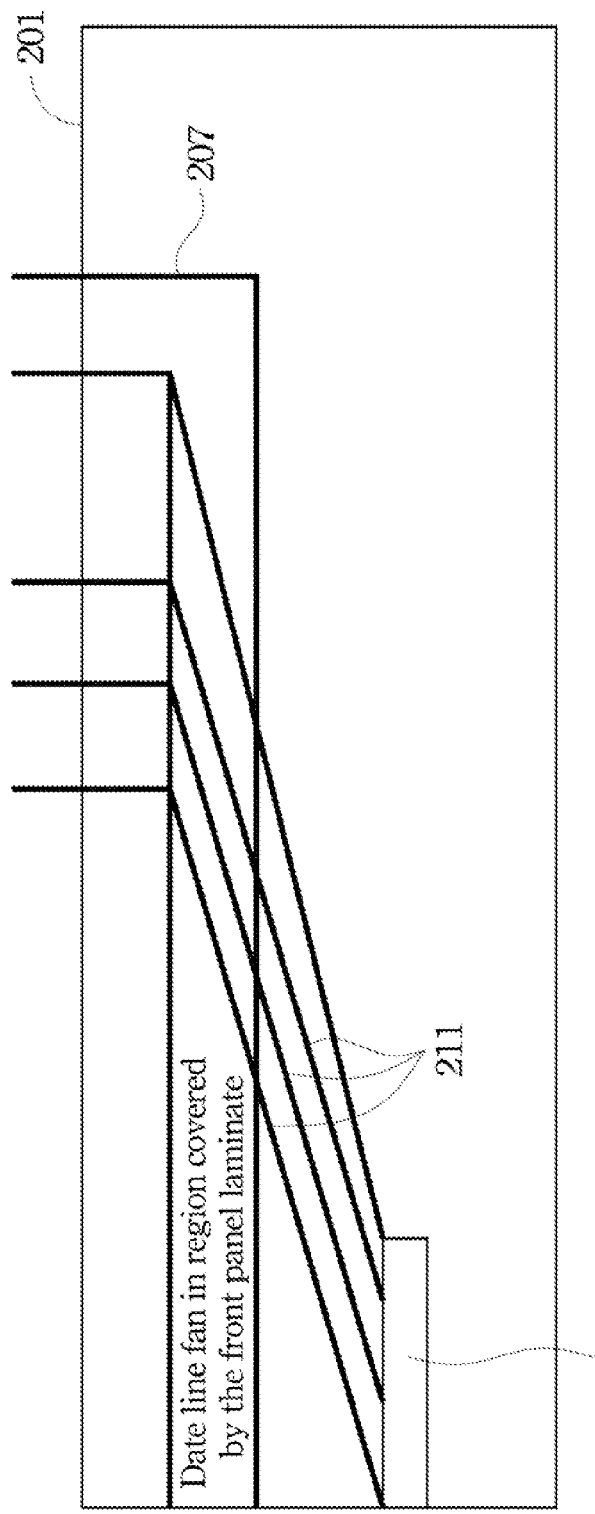

FIG. 2A to FIG. 2E present the concept of the display device and the panel according to the embodiment of this invention, in which FIG. 2A shows the circuit diagram of the display device's panel; FIG. 2B shows the top view of the placement of the display device's panel; FIG. 2C and FIG. 2D show the circuit diagram of the partial panel of the display device; and FIG. 2E shows the cross section view viewed from the line A-A' of the partial display device. The panel of the display device substantially includes active region 205 for displaying the images, the electrostatic protection circuit region 231 for preventing the electrostatic charge from damaging the display device elements, and the test circuit region 233 for testing the image displaying. The active region 205 substantially includes the pixel circuit 237. The electrostatic protection circuit region 231 includes the diodes 241 and the electrostatic discharge ring 239, in which the diode 241 deliver the electrostatic charges on the data line 211 and scan line 213 to the electrostatic discharge ring 239.

As shown in FIG. 2B to FIG. 2E, the region of the protection plane 209 covers the front panel laminate 207 while the front panel laminate 207 overlaps partial data line fan in region 201 and partial scan line fan in region 203. The front panel laminate 207 includes the conductive glue 221, the capsule 223, the conductive transparent metal 215, and the plastic substrate 219. Because the first metal layer or the second metal layer of the scan line 213 and the data line 211 is disposed under the flat layer 217, and the flat layer 217 is disposed under the front panel laminate 207, the potential on the data line 211 or the scan line 213 may cause the front panel laminate 207 to release the ions. The ions with the water vapor, electrically driven for a long time period, form the chemicals that corrode the insulating layer. As a result, the metal layer under the insulating layer is not protected, and the water as well as the vapor will permeate into and corrode the second metal layer and the first metal layer in the hot and humid environment, which cause the panel defects or the abnormal displaying.

Figure 3A:
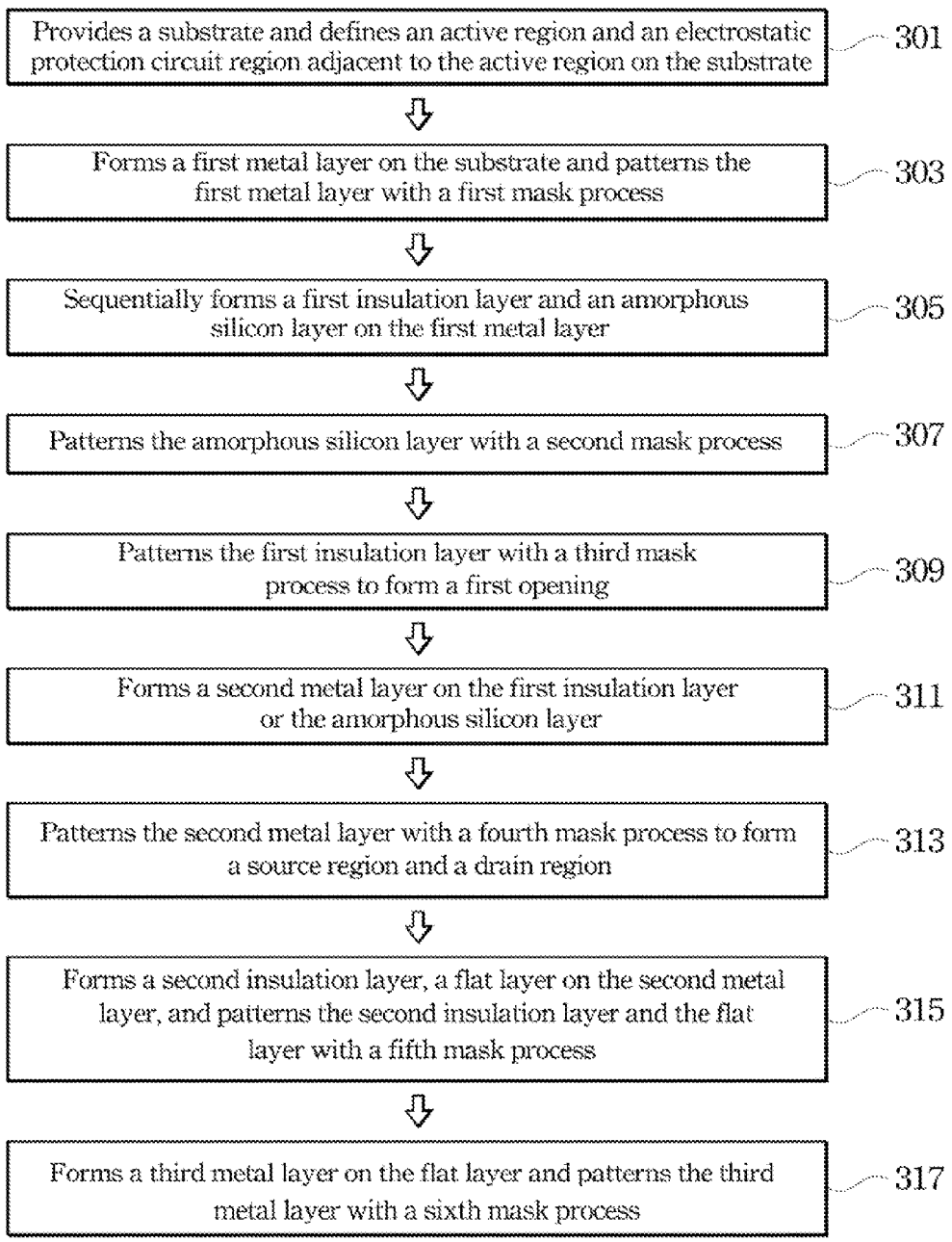
FIG. 3A shows the flow chart of the method for manufacturing the display device according to one embodiment of the invention.

FIG. 3A shows the flow chart of the method for manufacturing the display device according to one embodiment of the invention. The method, employed for manufacturing an electrophoretic display panel, provides a substrate and defines an active region and an electrostatic protection circuit region adjacent to the active region on the substrate (step 301); a first metal layer is formed on the substrate and patterned with a first mask process (step 303) by the method. Then, the method sequentially forms a first insulation layer (such as a gate insulation layer) and an amorphous silicon layer on the first metal layer (step 305), and the amorphous silicon layer is patterned with a second mask process (step 307).

After step 307, the method continues to pattern the first insulation layer with a third mask process to form a first opening (step 309), in which the first opening exposes part of the first metal layer. Then, the method forms a second metal layer on the first insulation layer or the amorphous silicon layer (step 311), in which the second metal layer fills the first opening to contact with the first metal layer. Through the first opening, the second metal layer can directly connect to the first metal layer without the third metal layer, which prevents the electrostatic charge or the vapor from entering and damaging the first metal layer, the second metal layer, and the structure thereon.

The method continues to patterns the second metal layer with a fourth mask process to form a source region and a drain region (step 313); the method also forms a second insulation layer as well as a flat layer on the second metal layer, and patterns the second insulation layer and the flat layer with a fifth mask process (step 315), in which the flat layer and the second insulation layer can be made of resin, silicon nitride (SiNx), acrylic fabric photoresistor, or Benzocyclobutene polymer. Particularly, the flat layer is overlapped the electrostatic protection circuit region, the data line fan in region, and the scan line fan in region. The area size of the flat layer can be greater than or equal to the area size of the front plane laminate, such that the metal of the data line or the scan line can be prevented from being corroded by the ion of the front plane laminate, and the line defects can be avoided.

Finally, the method forms a third metal layer on the flat layer and patterns the third metal layer with a sixth mask process (step 317). In addition, several kinds of semiconductor related processes can be imposed on the third metal layer, such as disposing the front panel laminate to form an electronic paper display (EPD).

Among the steps of the method of the embodiment, step 301 can further defines a data line fan in region, a scan line fan in region, or a test circuit region on the substrate; the method can make the size of the overlap area between the flat layer and the data line fan in region covered by the front panel laminate greater than 90%; the method can also alternatively make the size of the overlap area between the flat layer and the scan line fan in region covered by the front panel laminate greater than 90%. The flat layer can also overlap the test circuit region to prevent the data lines, the scan lines, and the test circuit from being damaged by the electrostatic charge or vapor.

Figure 3B:
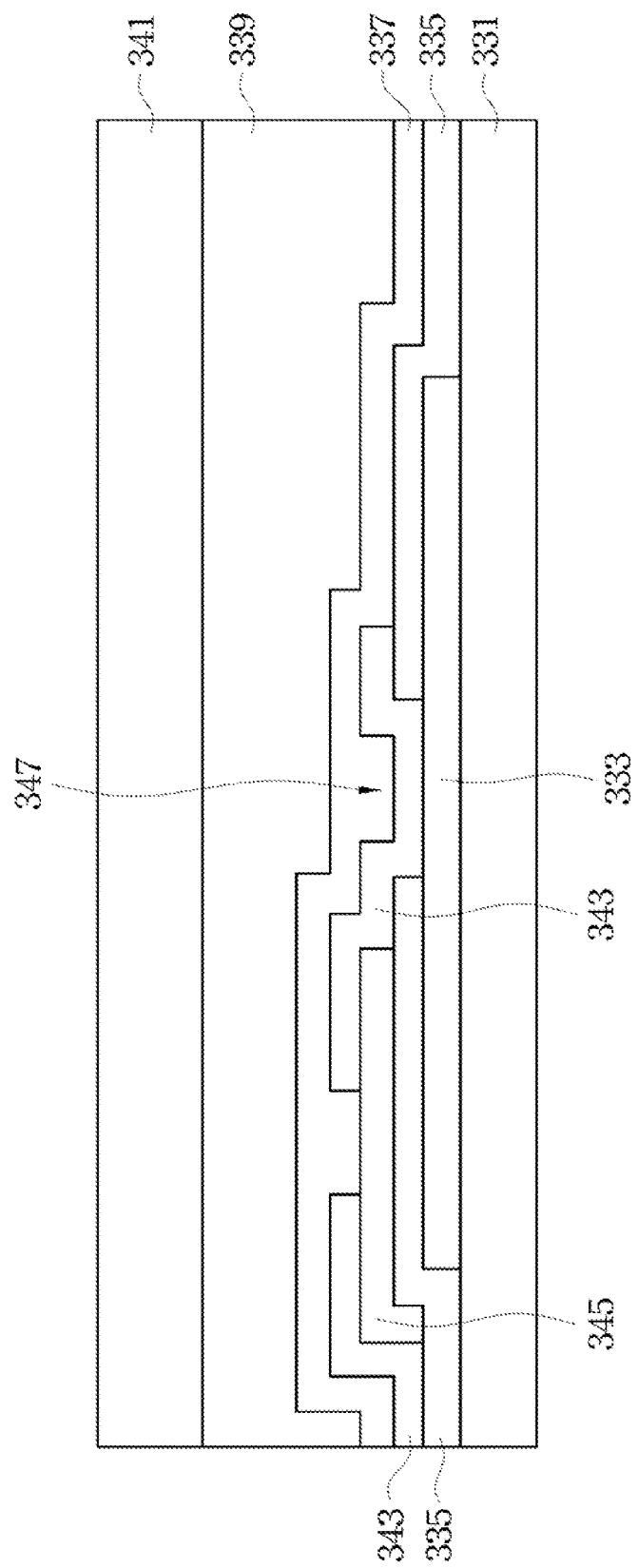
FIG. 3B shows the cross section view of the display device structure in the electrostatic protection circuit region according to one embodiment of the invention.

FIG. 3B shows the cross section view of the display device structure in the electrostatic protection circuit region according to one embodiment of the invention. The display device structure substantially includes a substrate 331, a first metal layer 333, a first insulation layer 335, an amorphous silicon layer 345, a first opening 347, a second metal layer 343, a second insulation layer 337, a flat layer 339, and other structure manufactured from the semiconductor process, such as the front panel laminate 341.

The substrate 331 includes an active region and an electrostatic protection circuit region adjacent to the active region; the substrate 331 can further includes a data line fan in region and a scan line fan in region to respectively place the data lines and the scan lines. Particularly, FIG. 3B mainly depicts the electrostatic protection circuit region of the substrate 331 and the structure thereon. The first metal layer 333 is disposed on the substrate 331, and the first insulation layer 335 as well as the amorphous silicon layer 345 are sequentially disposed on the first metal layer 333. The first opening 347 pass through the amorphous silicon layer 345 to expose partial first metal layer 333. The second metal layer 343 is disposed on the first insulation layer 335 or the amorphous silicon layer 345, in which the second metal layer 343 fills the first opening 347 to contact with the first metal layer 333.

The second insulation layer 337 is disposed on the second metal layer 343 and contacts with the amorphous silicon layer 345. The flat layer 339 is disposed on the second insulation layer 337, in which the flat layer 339 and the second insulation layer 337 can be made of Resin, silicon nitride (SiNx), or the combination thereof; the region of the flat layer 339 is overlapped the electrostatic protection circuit region, the test circuit region, and the data line fan in region as well as the scan line fan in region covered by a region of a front plane laminate. Furthermore, the front plane laminate 341 can be disposed on the flat layer 339 to form an electrophoretic display device.

In this embodiment, the second metal layer 343 can directly connect to the first metal layer 333 through the first opening 347 without the additional third metal layer, which prevents the electrostatic charge or the vapor from entering and damaging the first metal layer, the second metal layer through the outer third metal layer. Therefore, these layers and the structure thereon can be safely protected and can be kept away from the electrostatic charges or the vapor.

Figure 3C:
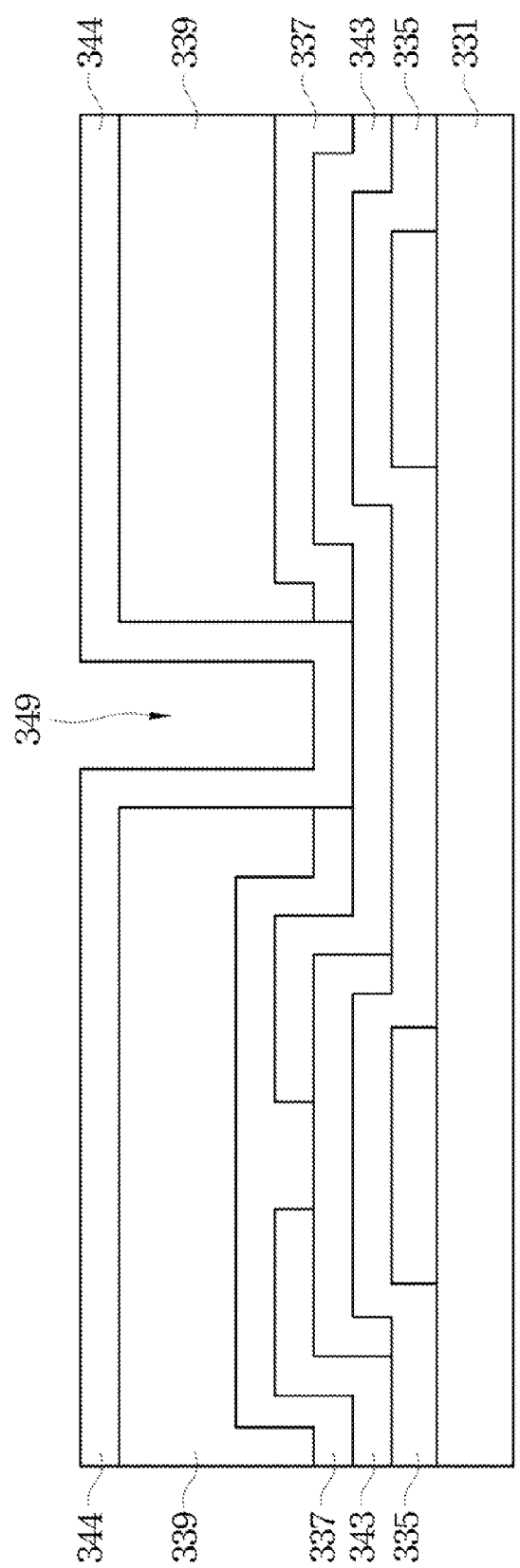
FIG. 3C shows the cross section view of the display device structure in the active region according to one embodiment of the invention.

FIG. 3C shows the cross section view of the display device structure in the active region according to one embodiment of the invention. In this embodiment, most of the element's numbers are the same with those in FIG. 3B and are labeled the same material layer, except the additional third metal layer 344 and the second opening 349. In detail, the second opening 349 passes through the second insulation layer 337 and the flat layer 339 for exposing the second metal layer 343, in which the third metal layer 344 fills the second opening 349 to contact with the second metal layer 343.

Figure 3D:
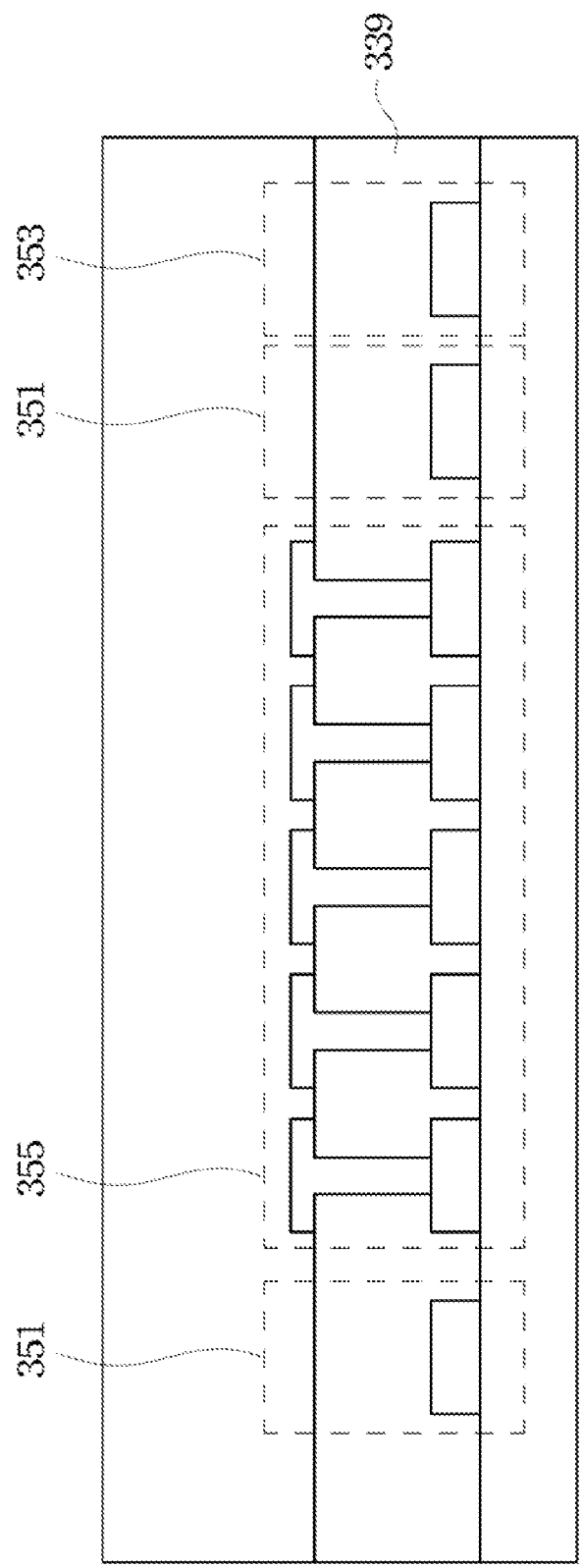
FIG. 3D shows the cross section view of the display device structure according to one embodiment of the invention.

FIG. 3D shows the cross section view of the display device structure according to one embodiment of the invention. As shown in FIG. 3D, the flat layer 339 covers the electrostatic protection circuit region 351, the test circuit region 353 and the active region 355 to prevent the vapor from corroding the electronic elements on the electrostatic protection circuit region 351, the test circuit region 353 and the active region 355.

The method for manufacturing a display device and the display device structure of the above embodiments take the same one mask process to pattern the second insulation layer and the flat layer, such that only six mask processes are required to manufacture the display device structure. Further, the first metal layer can directly connect to the second metal layer through the opening, no additional metal layer is required. Besides, the flat layer is coated to the electrostatic protection circuit region and the test circuit of the display device to prevent the electrostatic charge and the vapor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display device structure, comprising:
    a substrate comprising an active region and an electrostatic protection circuit region adjacent to the active region;
    a first metal layer disposed in the active region and the electrostatic protection circuit region;
    a first insulation layer disposed on the first metal layer in the active region and the electrostatic protection circuit region, wherein the first insulation layer has a first opening positioned in the electrostatic protection circuit region and passing through the first insulation layer to expose a portion of the first metal layer in the electrostatic protection circuit region;
    an amorphous silicon layer disposed on the first insulation layer of the active region and the electrostatic protection circuit region;
    a second metal layer disposed on the first insulation layer and the amorphous silicon layer in the active region and the electrostatic protection circuit region, wherein the second metal layer fills the first opening and in contact with the exposed portion of the first metal layer in the electrostatic protection circuit region;
    a second insulation layer disposed on the second metal layer, wherein the second insulation layer covers the entire first metal layer in the electrostatic protection circuit region and the entire second metal layer in the electrostatic protection circuit region;
    a flat layer disposed on the second insulation layer, wherein the flat layer covers the entire first metal layer in the electrostatic protection circuit region and the entire second metal layer in the electrostatic protection circuit region.

2. The display device structure as claimed in claim 1, wherein the substrate further comprising a data line fan in region for placing data lines, and the flat layer overlaps the data line fan in region covered by a region of a front plane laminate.

3. The display device structure as claimed in claim 1, wherein the substrate further comprises a scan line fan in region for placing scan lines, and the flat layer overlaps the scan line fan in region covered by a region of a front plane laminate.

4. The display device structure as claimed in claim 1, wherein the substrate further comprises a test circuit region, and the flat layer overlaps the test circuit region.

5. The display device structure as claimed in claim 1, further comprising a front plane laminate disposed on the flat layer to form an electrophoretic display device.

6. The display device structure as claimed in claim 1, wherein the flat layer is made of resin, acrylic fabric photoresistor, or Benzocyclobutene polymer, and the second insulation layer is made of silicon nitride.

7. A display panel structure of an electrophoretic display device, comprising:
    a substrate comprising an active region and an electrostatic protection circuit region adjacent to the active region;
    a first metal layer disposed in the active region and the electrostatic protection circuit region;
    a first insulation layer disposed on the first metal layer in the active region and the electrostatic protection circuit region, wherein the first insulation layer has a first opening positioned in the electrostatic protection circuit region and passing through the first insulation layer to expose a portion of the first metal layer in the electrostatic protection circuit region;
    an amorphous silicon layer disposed on the first insulation layer;
    a second metal layer disposed on the first insulation layer and the amorphous silicon layer in the active region and the electrostatic protection circuit region;
    a second insulation layer disposed on the second metal layer, wherein the second insulation layer covers the entire first metal layer in the electrostatic protection circuit region and the entire second metal layer in the electrostatic protection circuit region; and
    a flat layer disposed on the second insulation layer, wherein the flat layer covers the entire first metal layer in the electrostatic protection circuit region and the entire second metal layer in the electrostatic protection circuit region; and
    a third metal layer disposed on the flat layer.

8. The display panel structure as claimed in claim 7, wherein the substrate further comprises a scan line fan in region for placing scan lines, and the flat layer overlaps the scan line fan in region covered by a region of a front plane laminate.

9. The display panel structure as claimed in claim 7, further comprising a front plane laminate disposed on the flat layer to form an electrophoretic display device.

10. The display panel structure as claimed in claim 7, wherein the flat layer is made of resin, acrylic fabric photoresistor, or Benzocyclobutene polymer, and the second insulation layer is made of silicon nitride.

* * * * *